(12) United States Patent
Bhagwagar

(10) Patent No.: US 6,791,839 B2
(45) Date of Patent: Sep. 14, 2004

(54) THERMAL INTERFACE MATERIALS AND METHODS FOR THEIR PREPARATION AND USE

(75) Inventor: Dorab Edul Bhagwagar, Midland, MI (US)

(73) Assignee: Dow Corning Corporation, Mildland, MI (US)

( * ) Notice: Subject to any disclaimer, the term of this patent is extended or adjusted under 35 U.S.C. 154(b) by 203 days.

(21) Appl. No.: 10/183,789

(22) Filed: Jun. 25, 2002

(65) Prior Publication Data

US 2003/0234074 A1 Dec. 25, 2003

(51) Int. Cl.$^7$ ............... H05K 7/20; C09J 183/04; C08L 83/04; C08K 3/08
(52) U.S. Cl. ............... 361/705; 361/704; 361/707; 361/708; 361/709; 156/327; 428/332; 428/339; 523/400; 523/440; 523/457; 523/459; 523/460; 524/403; 524/408; 524/413; 524/860; 524/861; 524/862; 524/866
(58) Field of Search ................ 428/413, 414, 428/416, 418, 423.1, 447, 448, 450, 473.5, 474.4, 480, 458, 460, 461, 463, 500, 523, 332, 339; 523/400, 440, 457, 459, 460; 524/80, 401, 403, 408, 413, 858, 859, 860, 861, 862, 866; 361/704, 705, 707, 708, 709; 257/717; 156/327, 329, 330, 330.9, 331.1

(56) References Cited

U.S. PATENT DOCUMENTS

| | | | |
|---|---|---|---|
| 4,087,585 A | 5/1978 | Schulz | 428/429 |
| 4,147,669 A | 4/1979 | Shaheen et al. | 252/512 |
| 4,323,914 A | 4/1982 | Berndlmaier et al. | 357/82 |
| 4,557,857 A | 12/1985 | Sorensen | 252/503 |
| 4,607,277 A | 8/1986 | Hassan et al. | 357/81 |
| 4,766,176 A | 8/1988 | Lee et al. | 525/100 |
| 4,915,167 A | 4/1990 | Altoz | 165/185 |
| 5,017,654 A | 5/1991 | Togashi et al. | 525/100 |
| 5,056,706 A | 10/1991 | Dolbear et al. | 228/180.2 |
| 5,062,896 A | 11/1991 | Huang et al. | 106/287.19 |
| 5,097,387 A | 3/1992 | Griffith | 361/385 |
| 5,136,365 A | 8/1992 | Pennisi et al. | 357/72 |
| 5,170,930 A | 12/1992 | Dolbear et al. | 228/123 |
| 5,194,649 A | 3/1993 | Okawa | 556/451 |
| 5,198,189 A | 3/1993 | Booth et al. | 420/555 |
| 5,286,417 A | 2/1994 | Mahmoud et al. | 252/518 |
| 5,323,294 A | 6/1994 | Layton et al. | 361/699 |
| 5,328,087 A | 7/1994 | Nelson et al. | 228/175 |
| 5,376,403 A | 12/1994 | Capote et al. | 427/96 |
| 5,445,308 A | 8/1995 | Nelson et al. | 228/121 |
| 5,455,383 A | 10/1995 | Tanaka | 174/36 |
| 5,463,190 A | 10/1995 | Carson et al. | 174/259 |
| 5,561,590 A | 10/1996 | Norell et al. | 361/699 |
| 5,572,404 A | 11/1996 | Layton et al. | 361/699 |
| 5,808,874 A | 9/1998 | Smith | 361/769 |
| 5,853,622 A | 12/1998 | Gallagher et al. | 252/512 |
| 5,958,590 A | 9/1999 | Kang et al. | 428/403 |
| 6,059,952 A | 5/2000 | Kang et al. | 205/143 |
| 6,169,142 B1 | 1/2001 | Nakano et al. | 524/862 |
| 6,392,890 B1 * | 5/2002 | Katchmar | 361/705 |
| 2003/0194537 A1 * | 10/2003 | Bhagwagar et al. | 428/174 |

FOREIGN PATENT DOCUMENTS

| | | |
|---|---|---|
| EP | 101 167 | 2/1984 |
| EP | 942 436 | 9/1999 |
| JP | 07-207160 | 8/1995 |
| JP | 2002-329989 | 11/2002 |
| WO | WO 92/22090 | 12/1992 |

OTHER PUBLICATIONS

Abstract of JP 56–045515 Apr. 25, 1981.*
Abstract of JP 61–113622 May 31, 1996.*
Abstract of JP 62–109857 May 21, 1987.*
"Silicon Compounds (Silicones)," Kroschwitz, J. ed., Kirk Othmer Encyclopedia of Chemical Technology, 4th ed., John Wiley & Sons, Inc., New York. vol. 22, 1997, pp. 94–98.
"Standard Test Method for Thermal Difusivity of Solids by the Flash Method," ASTM Test Method E1461–92.
"Epoxy Resins," Louis V. McAdams and John A. Gannon, Encyclopedia of Polymer Science and Engineering, edited by H.F. Mark, N.M. Bikales, C.G. Overberger, G. Menges, J.I. Kroschwitz, John Wiley & Sons, 1989, vol. 6, p. 322.
"Epoxy Curing Agents," Cogin G. Hull and John H. Sinclair, Handbook of Coating Additives. Ed. Leonard J. Calbo, Marcel Dekker, 1987, vol. 2, p. 277.
"Silane Coupling Agents (Adhesion Promoters)" by Peter G. Pape in The Polymeric Materials Encyclopedia, Ed. Joseph C. Salamone, CRC Press, 1996.
"Modern Solder Technology for Competitive Electronics Manufacturing," by Jennie S. Hwang, McGraw Hill, 1996, p. 123.

(List continued on next page.)

Primary Examiner—Philip Tucker
Assistant Examiner—Michael J Feely
(74) Attorney, Agent, or Firm—Catherine U. Brown

(57) ABSTRACT

A composition that can be used to prepare a thermal interface material includes: A) a curable matrix having a curing temperature, B) a metal filler having a low melting point, optionally C) a spacer, and optionally D) a conductive filler. The temperature at which component B) commences softening is less than the curing temperature of component A). A thermal interface material is prepared by: 1) interposing the composition between an electronic component and a heat spreader to form a bondline, 2) heating the composition to a temperature higher than the temperature at which component B) commences softening but less than the curing temperature of component A) and optionally applying pressure to the composition, and 3) heating the composition to a temperature greater than or equal to the curing temperature of component A). The average particle size of component B) is greater than or equal to the bondline thickness.

17 Claims, 1 Drawing Sheet

OTHER PUBLICATIONS

"Measurements of Adhesive Bondline Effective Thermal Conductivity and Thermal Resistance Using the Laser Flash Method." R.C. Campbell, S.E. Smith, R.L. Dietz, IEEE Semi–Therm XV Symposium, (1999), pp. 83–97.

"Laser Flash Diffusivity Measurements of Filled Adhesive Effective Thermal Conductivity and Contact Resistance Using Multilayer Methods," R.C. Campbell, S.E. Smith, R.L. Dietz, Thermal Conductivity 25—Thermal Expansion 13, Jun. 13–16, 1999.

* cited by examiner

THERMAL INTERFACE MATERIALS AND METHODS FOR THEIR PREPARATION AND USE

FIELD OF THE INVENTION

This invention relates to a thermal interface material (TIM). More particularly, this invention relates to a TIM comprising a curable matrix and a low melting metal filler.

BACKGROUND

Electronic components such as semiconductors, transistors, integrated circuits (ICs), discrete devices, and others known in the art are designed to operate at a normal operating temperature or within a normal operating temperature range. However, the operation of an electronic component generates heat. If sufficient heat is not removed, the electronic component will operate at a temperature significantly above its normal operating temperature. Excessive temperatures can adversely affect performance of the electronic component and operation of the device associated therewith and negatively impact mean time between failures.

To avoid these problems, heat can be removed by thermal conduction from the electronic component to a heat sink. The heat sink can then be cooled by any convenient means such as convection or radiation techniques. During thermal conduction, heat can be transferred from the electronic component to the heat sink by surface contact between the electronic component and the heat sink or by contact of the electronic component and heat sink with a TIM.

Surfaces of the electronic component and the heat sink are typically not completely smooth, therefore, it is difficult to achieve full contact between the surfaces. Air spaces, which are poor thermal conductors, appear between the surfaces and impede the removal of heat. Inserting a TIM between the surfaces of the electronic component and heat sink can fill these spaces to promote efficient heat transfer. The lower the thermal impedance of the TIM, the greater the heat flow from the electronic component to the heatsink.

Most TIMs are based on thermosetting or thermoplastic polymeric matrices. However, the thermal conductivity of conformable polymers is rather low, typically in the range of 0.15 to 0.30 W/mK. To increase the thermal conductivity of the TIM, thermally conductive fillers can be added to the polymeric matrices. The thermal conductivity of these filled TIMs depends on various factors including the thermal conductivity of filler and the packing of filler in the polymeric matrix as dictated by filler particle size and filler particle size distribution.

The effectiveness of the heat transfer between two substrates through the TIM is expressed in terms of thermal impedance or thermal resistance. The thermal impedance or thermal resistance is the summation of bulk resistance of the TIM and interfacial resistance between the TIM and the substrates. At thin TIM bondlines, contributions from interfacial resistance can dominate the total resistance. Since the fillers in these TIM do not make intimate contact with the substrates, interfacial resistance can be high. Consequently, this can translate into higher overall thermal impedance at thin bondlines.

SUMMARY OF THE INVENTION

This invention relates to a composition that can be used as a thermal interface material. The composition comprises:

A) a curable matrix having a curing temperature,
B) a low melting metal filler having a softening temperature, and
C) a spacer.

The temperature at which component B) commences softening is less than the curing temperature of component A). The average particle size of component B) is greater than the average particle size of component C).

This invention further relates to a method for preparing a thermal interface material. The method comprises:

1) interposing a composition between a first substrate and a second substrate to form a bondline having a bondline thickness, where the composition comprises
   A) a curable matrix having a curing temperature,
   B) a low melting metal filler having a softening temperature, and
   optionally C) a spacer, and
   with the provisos that
   i) the softening temperature of component B) is less than the curing temperature of component A), and
   ii) the average particle size of component B) is greater than or equal to the bondline thickness; and
2) heating the composition.

DETAILED DESCRIPTION OF THE INVENTION

Figure 1:
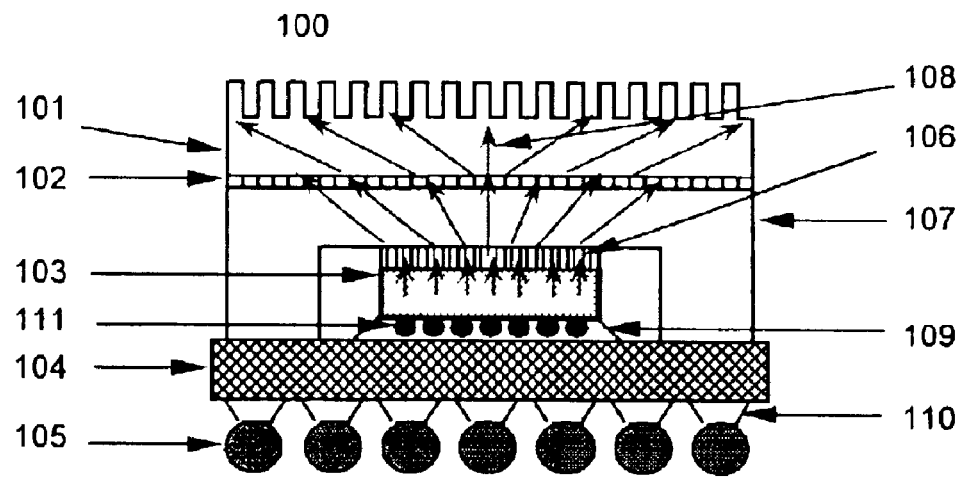
FIG. 1 is a device according to this invention.

All amounts, ratios, and percentages are by volume unless otherwise indicated. The following is a list of definitions, as used herein.

Definitions and Usage of Terms

"A" and "an" each mean one or more.

"Combination" means two or more items put together by any method.

"Siloxane" and "silicone" are used interchangeably.

"Softening temperature" means the temperature at which plastic deformation occurs under the pressure applied.

Thermal conductivity (k) in units of (W/m K), is related to the ability to transfer heat (Q) across a material of thickness $\Delta x$ and area A, resulting in a temperature differential of $\Delta T$, and is mathematically defined by the equation:

$$\dot{Q} = k \frac{A}{\Delta x} \Delta T.$$

Thermal Impedance (R) in units of ($cm^2$ K/W) is related to the effectiveness of heat transfer of a material between 2 interfaces, and is mathematically defined by the equation:

$$R = \frac{A}{\dot{Q}} \Delta T = \frac{\Delta x}{k}.$$

"Surface treated" means that all, or a portion of reactive groups on a filler particle have been rendered less reactive by any convenient chemical or unreactive means.

Composition

This invention relates to a composition comprising

A) a curable matrix having a curing temperature,
B) a low melting metal filler having a softening temperature, and
C) a spacer.

The softening temperature of component B) is less than the curing temperature of component A). The average particle size of component B) is greater than the average particle size of component C).

Matrix

Component A) is a curable matrix that binds the components in the composition. The composition can comprise at least 25% of component A). The composition can comprise up to 75% of component A).

Suitable curable matrices for component A) are exemplified by polysiloxanes, epoxies, phenolics, novolac resins, polyacrylates, polyurethanes, polyimides, polyesters, maleimide resins, cyanate esters, polyimides, polyureas, cyanoacrylates, and combinations thereof. The cure chemistry would be dependant on the polymer or resin utilized for component A). For example, a siloxane matrix can comprise an addition reaction curable matrix, a condensation reaction curable matrix, a peroxide reaction curable matrix, or a combination thereof.

Suitable addition reaction curable silicone matrices for component A) can comprise:

I) a curable silicone base polymer,
II) a curing agent for component I),
III) a catalyst, and
optionally IV) a catalyst inhibitor.

Component I) can comprise an alkenyl-functional polyorganosiloxane. Component II) can comprise an organohydrogenpolysiloxane. Component III) can comprise a hydrosilylation catalyst. Component IV) can comprise a hydrosilylation reaction catalyst inhibitor. Component IV) can cause chemical or physical inhibition of the platinum catalyst, or a combination thereof, to control the cure temperature of the formulation.

A platinum catalyst inhibitor retards curing of the silicone composition at ambient temperature, but does not prevent the composition from curing at a desired elevated temperatures. Suitable chemicals to inhibit the platinum catalyst include various "ene-yne" systems such as 3-methyl-3-penten-1-yne and 3,5-dimethyl-3-hexen-1-yne; acetylenic alcohols such as 3,5-dimethyl-1-hexyn-3-ol, 1-ethynyl-l-cyclohexanol, and 2-phenyl-3-butyn-2-ol; maleates, malonates, phthalates, and fumarates, such as dialkyl, dialkenyl, and dialkoxyalkyl fumarates, malonates, phthalates, and maleates; phosphines and diphosphines.

The hydrosilylation catalyst can be physically separated, for example the catalyst may be encapsulated in a thermoplastic resin. Such microencapsulated hydrosilylation catalysts and methods of preparing them are described in U.S. Pat. No. 4,766,176 and the references cited therein; and U.S. Pat. No. 5,017,654. Methods of preparing microencapsulated hydrosilylation catalysts are well known in the art. Examples of such methods include, but are not limited to, chemical methods such as interfacial polymerization and in situ polymerization; physico-chemical methods, such as coacervation and emulsion/suspension hardening; and physical-mechanical methods, such as spray drying.

Physically inhibited hydrosilylation catalysts are exemplified by a microencapsulated platinum group metal-containing catalyst comprising a platinum group metal encapsulated in a thermoplastic resin. Compositions containing microencapsulated hydrosilylation catalysts are stable for extended periods of time, typically several months or longer, under ambient conditions, yet cure relatively rapidly at temperatures above the melting or softening point of the thermoplastic resin(s).

Suitable condensation reaction curable silicone matrices for component A) can comprise:

a) a silanol functional compound,
b) an silicon bonded alkoxy functional compound, and
c) a condensation catalyst.

Component a) can comprise polydimethylsiloxane diol, Component b) can comprise an alkoxy functional polydiorganosiloxane such as an alkoxy functional polydimethylsiloxane. Component c) can comprise a tin catalyst such as tin complexes with carboxylic acids, or titanate catalyst, such as titanate complexes with alcohols.

Suitable peroxide reaction curable silicone matrices for component A) can comprise:

i) a polyorganosilxoane, and
ii) an organic peroxide.

Suitable polyorganosiloxanes include polydiorgansiloxanes. Examples include polydimethylsiloxanes and poly(methylvinyl-co-dimethyl siloxanes).

Suitable organic peroxides include aroyl chlorides such as dibenzoyl bis-p-chlorobenzoyl peroxide and bis-2,4-dichlorobenzoyl peroxide; alkylaroyl peroxides such as dicumyl peroxide; and dialkyl peroxides such as di-t-butylperoxide and 2,5-dimethyl-2,5-di-t-butylperoxyhexane.

Curable silicone matrix formulations suitable for use as component A) are known in the art and are commercially available. For example, suitable hydrosilylation curable silicone formulations are disclosed in "Silicon Compounds (Silicones)," Kroschwitz, J. ed., *Kirk Othmer Encyclopedia of Chemical Technology*, 4th ed., John Wiley & Sons, Inc., New York, vol. 22, 1997, pp. 95–96. Suitable condensation curable silicone formulations are disclosed in"Silicon Compounds (Silicones)," Kroschwitz, J. ed., *Kirk Othmer Encyclopedia of Chemical Technology*, 4th ed., John Wiley & Sons, Inc., New York, vol. 22, 1997, pp. 96–98. Suitable peroxide curable silicone formulations are disclosed in "Silicon Compounds (Silicones)," Kroschwitz, J. ed., *Kirk Othmer Encyclopedia of Chemical Technology*, 4th ed., John Wiley & Sons, Inc., New York, vol. 22, 1997, pp. 94–95.

Suitable epoxy curable matrices for component A) can comprise:

I) an epoxy functional polymer or prepolymer,
II) a curing agent for component I), and
optionally III) a catalyst Component I) can comprise epichlorohydrin-bisphenol A resins, epoxy phenol novolac resins, epoxy cresol novolac resins, cycloaliphatic epoxy resins, and epoxy functional polymers such as epoxy functional silicones. Component II) can comprise primary and secondary amines, carboxylic acids, acid anhydrides, polyamines, polyamides, and other nitrogen containing compounds such as dicyandiamides, imidazoles, and dihydrazides. Optionally, component III) can be added to provide latent cure capabilities to the epoxy formulation. Such catalysts comprise imidazoles, boron trifluoride complexes, and boron trichloride complexes.

Curable epoxy matrix formulations suitable for use as component A) are known in the art and are commercially available. For example, suitable epoxy formulations are disclosed in Louis V. McAdams and John A. Gannon, "Epoxy Resins" in *Encyclopedia of Polymer Science and Engineering*, Edited by H. F. Mark, N. M. Bikales, C. G. Overberger, G. Menges, J. I. Kroschwitz, John Wiley & Sons, 1989, vol. 6, page 322; and Cogin G. Hull and John H. Sinclair, "Epoxy Curing Agents" in *Handbook of Coating Additives*, Ed. Leonard J. Calbo, Marcel Dekker, 1987, vol. 2, page 277.

Filler

Component B) is a low melting metal filler. The composition can comprise at least 25% of component B). The composition can comprise up to 75% of component B).

The low melting metal filler can be a eutectic alloy, a non-eutectic alloy, or a pure metal. The low melting metal filler can comprise Bi, In, Sn, or an alloy thereof. The low melting metal filler may optionally further comprise Ag, Au, Cd, Cu, Pb, Sb, Zn, or a combination thereof. Examples of suitable low melting metal fillers include In—Bi—Sn alloys, Sn—In—Zn alloys, Sn—In—Ag alloys, Sn—Ag—Bi alloys, Sn—Bi—Cu—Ag alloys, Sn—Ag—Cu—Sb alloys, Sn—Ag—Cu alloys, Sn—Ag alloys, Sn—Ag—Cu—Zn alloys, and combinations thereof. Low melting metal fillers are known in the art and commercially available. For example, low melting metal fillers may be obtained from Indium Corporation of America, Utica, N.Y., U.S.A.; Arconium, Providence, R.I., U.S.A.; and AIM Solder, Cranston, R.I., U.S.A.

The temperature at which the low melting metal filler commences softening is less than the curing temperature of the curable matrix. Without wishing to be bound by theory, it is thought that if the low melting metal filler commences softening at a temperature higher than the curing temperature of the curable matrix, then the cured product of the composition will have thermal impedance that is too high for some applications. Without wishing to be bound by theory, it is thought that the reason the cured product of the composition will have thermal impedance too high for some applications is that component B) is not deformed sufficiently to lower interfacial resistance and provide a good thermal path between substrates that the composition contacts.

Without wishing to be bound by theory, it is thought that the low melting metal filler contains little or no Ga or Hg. Ga and Hg can cause problems with respect to toxicity of the composition or performance of the composition as a TIM because oxidation of component B) may occur when component B) contains Ga, Hg, or both. Furthermore, some alloys that containg Ga or Hg can suffer from the drawback of not being obtainable in atomized form.

The low melting metal filler can have a melting point of up to 250° C., alternatively up to 225° C. The low melting metal filler can have a melting point of at least 50° C. The low melting metal filler need not have a single sharp melting temperature. Depending on the alloy composition, the low melting metal filler can be non-eutectic with a broad melting range. Such a low melting metal filler would have a temperature at which the alloy starts to melt (solidus temperature) and a temperature at which the low melting metal filler is completely molten (liquidus temperature). Without wishing to be bound by theory, it is thought that a melting range would be advantageous in that if the operating temperature is close to or just above the solidus temperature but less than the liquidus temperature, the low melting metal filler would serve to relieve stresses introduced during operation. Also, since the low melting metal filler is not completely molten at the operating temperature, it would have improved stability to oxidative degradation.

Softening temperature is less than solidus temperature. The exact relationship between softening temperature and solidus temperature differs for each specific low melting metal filler. For example, some alloys that contain Indium have a softening point under normal assembly pressures that is significantly lower than the solidus temperature of the alloy. On the other hand, some alloys that contain large amount of Bismuth as a constituent have a softening point that is very close to the solidus temperature of the alloy.

The low melting metal filler has an average particle size greater than the bondline thickness of the cured product of the composition. For example, spacers can be added to the composition to control bondline thickness of the cured product thereof. When spacers are present, the average particle size of the low melting metal filler is greater than the average particle size of the spacers. Without wishing to be bound by theory, it is thought that if the low melting metal filler has an average particle size less than the bondline thickness, the cured product of the composition will have thermal impedance that is too high for some applications. Without wishing to be bound by theory it is thought that the reason the cured product of the composition will have thermal impedance that is too high for some applications is that component B) is not deformed sufficiently when the composition, or the cured product thereof, is placed between substrates to provide a good thermal path between the substrates.

Optional Components

The composition may further comprise one or more optional components. Optional components include C) a spacer, D) a conductive filler, E) a treating agent for component D), F) an adhesion promoter, G) a vehicle, H) a surfactant, I) a flux agent, J) an acid acceptor and a combination thereof.

Component C) is a spacer. Spacers can comprise organic particles, inorganic particles, or a combination thereof. Spacers can be thermally conductive, electrically conductive, or both. Spacers can have a particle size of at least 25 micrometers up to 125 micrometers. The average particle of component C) is lower than the average particle size of component B). Spacers can comprise monodisperse beads, such as glass or polymer (e.g., polystyrene) beads. Spacers can comprise thermally conductive fillers such as alumina, aluminum nitride, atomized metal powders, boron nitride, copper, and silver. The amount of component C) depends on various factors including the particle size distribution, pressure to be applied during placement of the composition, and temperature during placement. The composition can contain at least 0.05%, alternatively at least 0.1% of component C). The composition can contain up to 2% of component C). Component C) can be added to control bondline thickness of the cured product of the composition.

Component D) is a thermally conductive filler that can be added in addition to component C), or instead of a portion of component C). The amount of component D) in the composition depends on various factors including the materials selected for component A) and component B), and the amounts of each component in the composition. The amount of component D) can be at least 5% of the composition. The amount of component D) can be up to 35% of the composition, alternatively up to 25%, alternatively up to 10%.

Component D) can be thermally conductive and electrically conductive. Alternatively, component D) can be thermally conductive and electrically insulating. Suitable thermally conductive fillers for component D) include metal particles, metal oxide particles, and a combination thereof. Suitable thermally conductive fillers for component D) are exemplified by aluminum nitride; aluminum oxide; barium titinate; beryllium oxide; boron nitride; diamond; graphite; magnesium oxide; metal particulate such as copper, gold, nickel, or silver; silicon carbide; tungsten carbide; zinc oxide, and a combination thereof.

Thermally conductive fillers are known in the art and commercially available, see for example, U.S. Pat. No. 6,169,142 (col. 4, lines 7–33). For example, CB-A20S and A1-43-Me are aluminum oxide fillers of differing particle sizes commercially available from Showa-Denko, and AA-04, AA-2, and AA18 are aluminum oxide fillers commercially available from Sumitomo Chemical Company. Silver filler is commercially available from Metalor Technologies U.S.A. Corp. of Attleboro, Mass., U.S.A. Boron nitride filler is commercially available from Advanced Ceramics Corporation, Cleveland, Ohio, U.S.A.

The shape of the thermally conductive filler particles is not specifically restricted, however, rounded or spherical particles may prevent viscosity increase to an undesirable level upon high loading of the thermally conductive filler in the composition.

A combination of thermally conductive fillers having differing particle sizes and different particle size distributions may be used as component D). For example, it may be desirable to combine a first aluminum oxide having a larger average particle size with a second aluminum oxide having a smaller average particle size in a proportion meeting the closest packing theory distribution curve. This improves packing efficiency and may reduce viscosity and enhance heat transfer.

The average particle size of the filler will depend on various factors including the type of filler selected for component D), the exact amount added to the composition, and the average particle sizes of component B) and component C). Component D) has a particle size less than or equal to the maximum particle size of component C). Component D) has a particle size less than the maximum particle size of component B). However, the thermally conductive filler can have an average particle size of at least 0.2 micrometers, alternatively at least 2 micrometers. The thermally conductive filler can have an average particle size of up to 80 micrometers, alternatively up to 50 micrometers.

The thermally conductive filler for component D) may optionally be surface treated with component E) a treating agent. Treating agents and treating methods are known in the art, see for example, U.S. Pat. No. 6,169,142 (col. 4, line 42 to col. 5, line 2).

The composition may comprise at least 0.1% of component E). The composition may comprise up to 2% of component E).

The treating agent can be an alkoxysilane having the formula: $R^1_x Si(OR^2)_{(4-x)}$, where x is 1, 2, or 3; alternatively x is 3. $R^1$ is a substituted or unsubstituted monovalent hydrocarbon group of at least 1 carbon atom, alternatively at least 8 carbon atoms. $R^1$ has up to 50 carbon atoms, alternatively up to 30 carbon atoms, alternatively up to 18 carbon atoms. $R^1$ is exemplified by alkyl groups such as hexyl, octyl, dodecyl, tetradecyl, hexadecyl, and octadecyl; and aromatic groups such as benzyl, phenyl and phenylethyl. $R^1$ can be saturated or unsaturated, branched or unbranched, and unsubstituted. $R^1$ can be saturated, unbranched, and unsubstituted.

$R^2$ is an unsubstituted, saturated hydrocarbon group of at least 1 carbon atom. $R^2$ may have up to 4 carbon atoms, alternatively up to 2 carbon atoms. Component E) is exemplified by hexyltrimethoxysilane, octyltriethoxysilane, decyltrimethoxysilane, dodecyltrimethyoxysilane, tetradecyltrimethoxysilane, phenyltrimethoxysilane, phenylethyltrimethoxysilane, octadecyltrimethoxysilane, octadecyltriethoxysilane, and a combination thereof.

Alkoxy-functional oligosiloxanes can also be used as treatment agents. Alkoxy-functional oligosiloxanes and methods for their preparation are known in the art, see for example, EP 1 101 167 A2. For example, suitable alkoxy-functional oligosiloxanes include those of the formula $(R^5O)_d Si(OSiR^3_2 R^4)_{4-d}$. In this formula, d is 1, 2, or 3, alternatively d is 3. Each $R^3$ can be independently selected from saturated and unsaturated monovalent hydrocarbon groups of 1 to 10 carbon atoms. Each $R^4$ can be a saturated or unsaturated monovalent hydrocarbon group having at least 11 carbon atoms. Each $R^5$ can be an alkyl group.

Metal fillers can be treated with alkylthiols such as octadecyl mercaptan and others, and fatty acids such as oleic acid, stearic acid, titanates, titanate coupling agents, zirconate coupling agents, and a combination thereof.

Treatment agents for alumina or passivated aluminum nitride could include alkoxysilyl functional alkylmethyl polysiloxanes (e.g., partial hydrolysis condensate of $R^6_b R^7_c Si(OR^8)_{(4-b-c)}$ or cohydrolysis condensates or mixtures), similar materials where the hydrolyzable group would be silazane, acyloxy or oximo. In all of these, a group tethered to Si, such as $R^6$ in the formula above, is a long chain unsaturated monovalent hydrocarbon or monovalent aromatic-functional hydrocarbon. $R^7$ is a monovalent hydrocarbon group, and $R^8$ is a monovalent hydrocarbon group of 1 to 4 carbon atoms. In the formula above, b is 1, 2, or 3 and c is 0, 1, or 2, with the proviso that b+c is 1, 2, or 3. One skilled in the art could optimize a specific treatment to aid dispersion of the filler without undue experimentation.

Component F) is. an adhesion promoter. Suitable adhesion promoters can comprise alkoxysilanes of the formula $R^1_a Si(OR^2)_{(4-a)}$, where a is 1, 2, or 3, alternatively a is 3. $R^1$ is a monovalent organofunctional group. $R^1$ can be an epoxyfunctional group such as glycidoxypropyl or (epoxycyclohexyl)ethyl, an amino functional group such as aminoethylaminopropyl or aminopropyl, a methacryloxypropyl, or an unsaturated organic group.

$R^2$ is an unsubstituted, saturated hydrocarbon group of at least 1 carbon atom. $R^2$ may have up to 4 carbon atoms, alternatively up to 2 carbon atoms. $R^2$ is exemplified by methyl, ethyl, n-propyl, and iso-propyl.

Examples of adhesion promoters suitable for given matrices are disclosed in "Silane Coupling Agents (Adhesion Promoters)" by Peter G. Pape in *The Polymeric Materials Encyclopedia*, Ed. Joseph C. Salamone, CRC Press, 1996. Examples of suitable adhesion promoters include glycidoxypropyltrimethoxysilane and a combination of glycidoxypropyltrimethoxysilane with an aluminum chelate or zirconium chelate. Examples of adhesion promoters for addition curable silicone matrices can be found in U.S. Pat. Nos. 4,087,585 and 5,194,649. The composition can contain at least 2% of adhesion promoter. The composition can contain up to 5% of adhesion promoter.

Component G) is a vehicle such as a solvent or diluent. Component G) can be added during preparation of the composition, for example, to aid mixing and delivery. All or a portion of component G) may optionally be removed after the composition is prepared.

Component H) is a surfactant. Suitable surfactants include silicone polyethers, ethylene oxide polymers, propylene oxide polymers, copolymers of ethyelene oxide and propylene oxide, other non-ionic surfactants, and combinations thereof. The composition can contain up to 0.05% of the surfactant based on the weight of the composition.

Component I) is a flux agent. The composition can contain up to 2% of the flux agent based on the weight of the composition. Molecules containing chemically active functional groups such as carboxylic acid and amines can be used as flux agents. Such flux agents can include aliphatic acids such as succinic acid, abietic acid, oleic acid, and adipic acid; aromatic acids such as substituted benzoic acids; aliphatic amines and their derivatives, such as triethanolamine, hydrochloride salts of amines, and hydrobromide salts of amines. Flux agents are commercially available and can be found in "Modern Solder Technology for Competitive Electronics Manufacturing" by Jennie S. Hwang, McGraw Hill, 1996, p. 123.

Component J) is an acid acceptor. Suitable acid acceptors include magnesium oxide, calcium oxide, and combinations thereof. The composition can contain up to 2% of component J) based on the weight of the composition.

Method of Preparation of the Composition

The composition can be formulated to have a thermal impedance of at most 1 centimeter squared Kelvin per Watt ($cm^2$ K/W). Thermal conductivity depends on various factors including the amount and type of filler selected for component B) and whether component D) is present.

The composition can be prepared by mixing all components at ambient or elevated temperature. When the composition is prepared at elevated temperature, the temperature during preparation is less than the curing temperature of component A).

A low melting metal can be pre-formed into a powder to prepare component B) by, for example, atomization. Atomization provides the advantage of minimal surface oxidation. Centrifugal or ultrasonic atomization in an inert atmosphere can be used to form spherical, satellite free powders with low surface oxide and consistent particle size distributions. The atomized powders may optionally be sieved (sorted) to obtain a desired size range. For example, when the composition will be used in a bondline thickness of 50 micrometers, component B) can have a particle size distribution of 45 to 73 micrometers, alternatively 53 to 73 micrometers.

Component B) may also be incorporated into the composition by in-situ shearing. An intermediate comprising the curable matrix and a low melting metal is heated to a temperature above the melting point of the low melting metal but below the curing temperature of the curable matrix. The composition is then subjected to an appropriate amount of shear to 'break' the low melting metal into a desired particle size. Surfactant may be added during this process to control particle size and distribution.

When component D) and component E) are present, the composition may optionally be prepared by surface treating component D) with component E) and thereafter mixing the product thereof with the other components of the composition.

Methods of Use

This invention further relates to a method for preparing a thermal interface material. The method comprises:

1) interposing a composition between a first substrate and a second substrate to form a bondline having a bondline thickness, where the composition comprises
   A) a curable matrix having a curing temperature,
   B) a metal filler having a low melting point,
   optionally C) a spacer, and
   optionally D) a conductive filler;
   with the provisos that
      i) the softening point of component B) is less than the curing temperature of component A), and
      ii) the average particle size of component B) is greater than or equal to the bondline thickness; and
2) heating the composition.

The first substrate can comprise a heat source such as an electronic component such as a semiconductor, a transistor, an integrated circuit, or a discrete device. The second substrate can comprise a heat spreader or a heat dissipation device such as a heat sink, a thermally conductive plate, a thermally conductive cover, a fan, a circulating coolant system, a combination thereof, or others. The composition can be applied either to the electronic component and thereafter the heat sink, the composition can be applied to the heat sink and thereafter to the electronic component, or the composition can be applied to the first and second substrates simultaneously.

During or after interposing the composition along the thermal path (or both during and after interposing the composition), the composition can be heated to a temperature equal to or greater than the melting temperature of component B), but less than the curing temperature of component A). Pressure may be applied during step 1), after step 1), during step 2), or combinations thereof. The composition can then be heated to a temperature greater than or equal to the curing temperature of component A).

This invention further relates to a product comprising:
   a) an electronic component,
   b) an interface material, and
   c) a heat sink;
   where the interface material is arranged along a thermal path extending from a surface of the electronic component to a surface of the heat sink, where the interface material comprises the cured product of the composition described above.

This invention further relates to a product comprising:
   a) a heat spreader or a heat dissipation device, and
   b) an interface material on a surface of component a),
   where the interface material and component a) are configured to comprise a portion of a thermally conductive path between an electronic component and a heat sink, and where the interface material comprises a cured product of the composition described above.

FIG. 1 shows a device 100 according to this invention. The device 100 comprises an electronic component (shown as an integrated circuit (IC) chip) 103 mounted to a substrate 104 by a solderball array 111 and chip underfill 109. The substrate 104 has solder balls 105 attached thereto through pads 110. A first interface material (TIM1) 106 is interposed between the IC chip 103 and a metal cover 107. The metal cover 107 acts as a heat spreader. A second interface material (TIM2) 102 is interposed between the metal cover 107 and a heat sink 101. Heat moves along a thermal path represented by arrows 108 when the device is operated.

EXAMPLES

These examples are intended to illustrate the invention to one skilled in the art and should not be interpreted as limiting the scope of the invention set forth in the claims.

Reference Example 1

Assembly Fabrication and Laser Flash Methodology

Thermal impedance measurement of the thermal interface materials are carried out on the Holometrix Microflash 300 equipment Holometrix Micromet, Bedford, Mass.; now NETZSCH Instruments, Inc. Nitride passivated silicon wafers used in the sample preparation are obtained from Addison Engineering, Inc. San Jose, Calif. The silicon wafers are diced to 8±0.13 millimeter (mm) square substrates and are deionized water rinsed by Silicon Sense, of Nashua, N.H.

To test the thermal impedance of a composition, the composition is dispensed on one substrate. A second substrate is placed on top of the dispensed composition to form a sandwiched assembly in a jig that provides a thin controlled bondline. The assembly is clamped with a binder clip and cured by placing in an oven for the required time and at the required cure temperature. After cure, the assembly is removed from the jig and a graphite coating is applied to both sides. The coating is applied to increase energy absorption and emittance from assembly surfaces.

The laser flash method involves rapidly heating one side of the assembly with a single pulse from a laser and monitoring the arrival of the resulting temperature disturbance as a function of time on the opposite surface. The thermal impedance of the thin TIM between the two substrates is measured using multi-layer analysis. Technical details of the method can be found in the instrument manual, as well as in publications by Campbell, R. C.; Smith, S. E.; Dietz, R. L., "Measurements of Adhesive Bondline Effective Thermal Conductivity and Thermal Resistance Using the Laser Flash Method," IEEE SEMI-THERM XV Symposium, (1999) pages 83–97; Campbell, R. C.; Smith, S. E.; Dietz, R. L "Laser Flash Diffusivity Measurements of Filled Adhesive Effective Thermal Conductivity and Contact Resistance Using Multilayer Methods," Thermal Conductivity 25—Thermal Expansion 13—Jun. 13–16, 1999; and "Standard Test Method for Thermal Difusivity of Solids by the Flash Method," ASTM Test Method E 1461-92.

Example 1
Composition Containing Sheared Particles

The following ingredients are used in Example 1.

Component I) is a mixture containing 35 wt % resin and 65 wt % polymer. The resin has $CH_2=CH(CH_3)_2SiO_{1/2}$ units, $(CH_3)_3SiO_{1/2}$ units, and $SiO_{4/2}$ units, where the mole ratio of $CH_2=CH(CH_3)_2SiO_{1/2}$ units and $(CH_3)_3SiO_{1/2}$ units combined to $SiO_{4/2}$ unit is 0.7, and the resin has a weight-average molecular weight of 22,000, a polydispersity of 5, and contains 5.5 mole percent (1.8 percent by weight) of vinyl groups. The polymer is a dimethylvinylsiloxy-terminated polydimethylsiloxane having a viscosity of 2 Pascal seconds (Pa s) at 25° C.

Component II) is $CH_3CH_2CH_2Si(OSi(CH_3)_2H)_3$.

Component III) is a mixture containing 40 percent by weight of a complex of platinum with 1,3-divinyl-1,1,3,3-tetramethyldisiloxane dispersed in a thermoplastic silicone resin, wherein the resin has 78 mole percent monophenylsiloxane units and 22 mole percent dimethylsiloxane units and the resin has a softening point of 80–90° C.; 55 percent by weight of a dimethylvinylsiloxy-terminated polydimethylsiloxane having a viscosity of 2 Pa s at 25° C. and a vinyl content of 0.2 percent by weight; and 5 percent by weight of a hexamethyldisilazane-treated fumed silica. The catalyst has a platinum content of 0.16 percent by weight.

Component IV) is phenyl butynol.

Component B) is an alloy in 2 millimeter (mm) shot form. The alloy is In51Sn16.5Bi32.5 with a eutectic melting point of 61° C.

Component F), the adhesion promoter, is a reaction product of hydroxy terminated methylvinyl siloxane and glycidoxypropyltrimethoxysilane.

Component H), the surfactant, is a silicone-polyether with the average structure $(CH_3)_3SiO(Si(CH_2)_2O)_{248}(SiCH_2R O)_{2.5}OSi(CH_3)_3$, where R is $(CH_2CH_2O)_{18}(CH_2CH(CH_3) O)_{18}OH$.

In a 1 ounce cup, 1.849 grams (g) of component I) and 17.808 g of component B) are combined. The cup is purged with nitrogen and placed in an oven at 80° C. for 10 minutes. The cup is removed from the oven and is mixed in a centrifugal mixer (Hauschild Model AM 501) for 26 seconds. This procedure is repeated three times until the resulting mixture has a smooth paste-like consistency.

9.56 g of the mixture are weighed in a fresh 1 ounce cup. 0.004 g of component H) is added. The cup is placed in an oven at 80° C. for 10 minutes. The cup is removed from the oven and is mixed in a centrifugal mixer (Hauschild) for 26 seconds.

0.067 g of component II), 0.060 g of component F), and 0.001 g of component IV) are added to the mixture. The resulting mixture is mixed with a spatula until visually uniform.

0.035 g of component III) is added, and the resulting mixture is mixed with a spatula.

The viscosity of the resulting composition as measured on a Brookfield Viscometer (Model DV1) at 0.5 revolutions per minute (rpm) is 393 Pa s at 25° C.

Thermal resistance ofthe composition between two silicon nitride passivated substrates is measured by the method of Reference Example 1. The assemblies are heated to 150° C. for 1 hour. The results are in Table 1. The thermal impedance extrapolated to a 25 micrometer ($\mu$m) bondline by a parabolic least squares fit was 0.07 centimeter squared Kelvin per Watt ($cm^2$ K/W).

TABLE 1

| Bondline thickness (micrometers) | Thermal impedance ($cm^2$ K/W). |
|---|---|
| 23 | 0.04 |
| 23 | 0.06 |
| 31 | 0.13 |
| 102 | 0.93 |
| 145 | 1.52 |

Example 2
Composition Containing Atomized Particles

The following ingredients are used in this example.

Component I) is a dimethylvinylsiloxy-terminated polydimethylsiloxane having a viscosity of 45 to 65 Pa s at 25° C.

Component II) is an organohydrogenpolysiloxane having $(CH_3)_3SiO_{1/2}$, $(CH_3)_2SiO_{2/2}$, and $CH_3HSiO_{2/2}$ units wherein the organohydrogenpolysiloxane contains 1.05% by weight of silicon-bonded hydrogen atoms and has a viscosity of 30 milliPascal seconds (m Pa s) at 25° C.

Component III) is a complex of platinum with 1,3-divinyl-1,1,3,3-tetramethyldisiloxane dispersed in a thermoplastic polycarbonate matrix. The matrix has a softening point of 140° C. The catalyst has a platinum content of 0.4 percent by weight Component IV) is a mixture containing 1% by weight diallyl maleate dispersed in 99% by weight of a dimethylvinylsiloxy-terminated polydimethylsiloxane having a viscosity of 2 Pa s at 25° C.

Component B) is an alloy in atomized powder form having a particle size of –325+500 mesh (25 to 45 $\mu$m). The alloy is In51Sn16.5Bi32.5 with a eutectic melting point of 61° C.

Component C) is alumina particles having an average particle size of 22 micrometers (CBA20S from Showa Denko KK).

Component D) is boron nitride (PT160S from Advanced Ceramic Corporation).

In a ¼ ounce cup, 1.203 g component I), 0.0274 g component C), 7.543 g component B), 0.105 g component D), 0.067 g component II), 0.085 g of component IV), 0.0354 g component III) are mixed in a centrifugal mixer (from Hauschild). The resulting composition has a viscosity of 491 Pa s at 25° C. as measured on Brookfield Viscometer at 0.5 rpm. Assemblies are prepared as in Reference Example 1. The composition is cured by heating to 160° C. for 1 hour. The thermal resistance for an assembly with nitride passivated silicon substrates at a 25 $\mu$m bondline is 0.08 $cm^2$°K/W.

Example 3
Effect of Filler Composition on Oxidative Stability

Assemblies of 25 μm bondline thickness are prepared as in Example 2, except that the composition of component B) is varied, while maintaining the same volume % filler loading. The assemblies are subjected to accelerated stress testing by placing the assemblies in a 85° C./85% Relative Humidity chamber (Model SM-8C from Thermotron, Holland, Mich., USA). The thermal impedance of the assemblies is measured as a function of time. The results are in Table 2.

TABLE 2

| Aging at 85° C./85% RH (days) | Thermal impedance (cm² K/W) in TIM with filler | | | | | | |
|---|---|---|---|---|---|---|---|
| | In51Bi32.5Sn16.5 (mp 61° C.) | | In 26Bi57Sn17 (mp 80° C.) | | In 12Bi52Sn36 (mp 60-138° C.) | | Sn42Bi58 (mp 138° C.) |
| 0 | 0.08 | *0%* | 0.12 | *0%* | 0.12 | *0%* | 0.14 *0%* |
| 4 | 0.11 | *45%* | 0.32 | *167%* | 0.12 | *0%* | 0.13 *-5%* |
| 7 | 0.17 | *113%* | 0.82 | *573%* | 0.13 | *8%* | 0.14 *3%* |
| 21 | 1.08 | *1280%* | 1.01 | *730%* | 0.16 | *28%* | 0.13 *-1%* |
| 35 | 1.22 | *1456%* | 1.16 | *856%* | 0.16 | *29%* | 0.15 *7%* |

The numbers in italics are the % change in thermal impedance from the initial value

Example 4
Effect of Matrix on Oxidative Stability

Samples are prepared by the method of Example 2, except that component I) is varied. The samples are tested by the method of Example 3. The results are in Table 3

TABLE 3

| Aging at 85° C./85% RH | Thermal impedance (cm² K/W) in TIM with matrix | | | | | |
|---|---|---|---|---|---|---|
| | Matrix 1 | | Matrix 2 | | Matrix 3 | |
| 0 | 0.08 | *0%* | 0.08 | *0%* | 0.15 | *22%* |
| 4 | 0.11 | *45%* | 0.11 | *42%* | 0.21 | *70%* |
| 7 | 0.17 | *113%* | 0.15 | *90%* | 0.23 | *82%* |
| 21 | 1.08 | *1280%* | 0.28 | *251%* | 0.63 | *407%* |
| 35 | 1.22 | *1456%* | 0.80 | *882%* | 1.36 | *993%* |

Matrix 1 contains component I) as in example 2. Matrix 2 contains a polymer of the formula [ViSiMe$_2$(OSiMeVi)$_8$(OSiMe$_2$)$_{1040}$(OSiMe(CH$_2$CH$_2$(CF$_2$)$_3$CF$_3$)$_{450}$OSiMe$_2$Vi] in place of component I) of example 2. Matrix 3 contains a polymer of the formula [ViSiMe$_2$(OSiMe(CH$_2$)$_2$CF$_3$)$_x$OSiMe$_2$Vi in place of component I) of example 2. In this example, Me represents a methyl group, Vi represents a vinyl group, and x has a value that provides a viscosity of 41 Pa s at 25° C.

Example 5 and Comparative Example 1
Relationship between Bondline Thickness and Filler Dimension for Low Thermal Impedance Component B), the low melting alloy filler used in example 2 is substituted with In26Bi57Sn17 (eutectic melting point 80° C.). Assemblies are prepared as in example 2, except that dimensions of component B) are varied and bondline thickness is varied by changing the spacer particle, component C), dimensions. The spacers are uniform glass microspheres purchased from Duke Scientific Corporation, Palo Alto, Calif. The microspheres had NIST traceable mean diameters of 30.1±2.1, 49.1±2.9, and 72.6±4.4 micrometers. The results are shown in Table 3.

TABLE 3

| Sample. | Bondline Thickness (micrometers) | Filler Dimensions (micrometers) | Thermal Impedance (cm² K/W) |
|---|---|---|---|
| Assembly A | 30 | 25–38 | 0.22 |
| Assembly B | 30 | 38–45 | 0.18 |
| Assembly C | 30 | 45–53 | 0.11 |
| Assembly D | 30 | 53–63 | 0.18 |
| Assembly E | 30 | 63–73 | 0.15 |

TABLE 3-continued

| Sample. | Bondline Thickness (micrometers) | Filler Dimensions (micrometers) | Thermal Impedance (cm² K/W) |
|---|---|---|---|
| Comparative Assembly A | 50 | 25–38 | 0.80 |
| Comparative Assembly B | 50 | 38–45 | 0.81 |
| Assembly F | 50 | 45–53 | 0.49 |
| Assembly G | 50 | 53–63 | 0.34 |
| Assembly H | 50 | 63–73 | 0.35 |
| Comparative Assembly C | 70 | 25–38 | 1.08 |
| Comparative Assembly D | 70 | 38–45 | 0.82 |
| Comparative Assembly E | 70 | 45–53 | 1.07 |
| Comparative Assembly F | 70 | 53–63 | 1.12 |
| Comparative Assemblly G | 70 | 63–73 | 1.20 |

Example 5 and Comparative Example 1 show that when the low melting metal filler has an average particle size greater than or equal to bondline thickness, then thermal impedance is minimized. When the low melting metal filler has an average particle size less than the bondline thickness, thermal impedance is significantly higher.

Example 6
Relationship between Melting Point of Filler and Cure Temperature The following ingredients are used in this example. Component I), component II), and component III) are the same as those in example 2.

Component IV) is a mixture containing 3% by weight phenyl butynol dispersed in 97% by weight of a dimethylvinylsiloxy-terminated polydimethylsiloxane having a viscosity of 2Pa s at 25° C.

Component B) is an alloy in atomized powder form having a particle size of −325+500 mesh (25 to 45 μm). The alloy is In52Sn48 with a eutectic melting point of 117° C.

Component C) is alumina particle having an average particle size of 22 micrometers (CBA20S from Showa Denko KK).

Samples are prepared as above in example 2. Changing component III) and component IV) changes the cure temperature of the composition.

| Cure temperature (° C.) | Bondline thinkness (micrometers) | Thermal Impedance (cm² K/W) |
|---|---|---|
| 145 | 27 | 0.04 |
| 115 | 26 | 0.06 |
| 94 | 34 | 0.16 |

Example 6 shows that when the cure temperature of the matrix is above the softening point of the low melting metal filler, the assembly bondline thickness and thermal impedance are significantly higher.

I claim:

1. A composition comprising:
   A) a curable matrix having a curing temperature,
   B) a low melting metal filler having a softening temperature,
   C) a spacer, and
   with the provisos that
      i) the softening temperature of component B) is less than the curing temperature of component A), and
      ii) the average particle size of component B) is greater than the average particle size of component C).

2. The composition of claim 1, where component A) comprises a polysiloxane, an epoxy, a phenolic, a novolac resin, a polyacrylate, a polyurethane, a polyimide, a polyester, a maleimide resin, a cyanate ester, a polyimide, a polyurea, a cyanoacrylate, or a combination thereof.

3. The composition of claim 1, where component A) comprises a polysiloxane comprising an addition reaction curable matrix, a condensation reaction curable matrix, a peroxide reaction curable matrix, or a combination thereof.

4. The composition of claim 1, where component A) comprises:
   I) a curable silicone base polymer,
   II) a curing agent for component I),
   III) a catalyst, and
   optionally IV) a catalyst inhibitor.

5. The composition of claim 4, where
   a) component I) comprises an alkenyl-functional polyorganosiloxane,
   b) component II) comprises an organohydrogenpolysiloxane,
   c) component III) comprises a hydrosilylation catalyst, and
   d) component IV) comprises a hydrosilylation reaction catalyst inhibitor.

6. The composition of claim 1, where
   a) component B) has a melting temperature of at least 50° C., and
   b) component B) has a melting temperature of up to 250° C.

7. The composition of claim 1, where component B) comprises a non-eutectic alloy.

8. The composition of claim 1, where component B) comprises Bi, In, Sn, or an alloy thereof.

9. The composition of claim 8, where component B) further comprises Ag, Au, Cd, Cu, Pb, Sb, Zn, or a combination thereof.

10. The composition of claim 1, further comprising:
    D) a conductive filler,
    E) a treating agent for component D),
    F) an adhesion promoter,
    G) a vehicle,
    H) a surfactant,
    I) a flux agent,
    J) an acid acceptor, or
    a combination thereof.

11. A device comprising:
    a) an electronic component,
    b) an interface material, and
    c) a heat sink;
    where the interface material is arranged along a thermal path extending from a surface of the electronic component to a surface of the heat sink, and where the interface material comprises a cured product of the composition of claim 1.

12. A device comprising:
    a) a heat spreader, and
    b) an interface material on a surface of the heat spreader,
    where the interface material and the heat spreader are configured to comprise a portion of a thermally conductive path between an electronic component and a heat sink, and where the interface material comprises a cured product of the composition of claim 1.

13. A method comprising:
    1) interposing a composition between a first substrate and a second substrate to form a bondline having a bondline thickness, where the composition comprises
       A) a curable matrix having a curing temperature, and
       B) a low melting metal filler having a softening temperature,
       with the provisos that
          i) the softening temperature of component B) is less than the curing temperature of component A), and
          ii) the average particle size of component B) is greater than or equal to the bondline thickness;
    2) heating the composition to a temperature less than the curing temperature of component A) and greater than or equal to the softening temperature of component B); and thereafter
    3) heating the composition to a temperature greater than or equal to the curing temperature of component A).

14. The method of claim 13, where the composition further comprises:
    C) a spacer,
    D) a conductive filler,
    E) a treating agent for component D),
    F) an adhesion promoter,
    G) a vehicle,
    H) a surfactant,
    I) a flux agent,
    J) an acid acceptor, or
    a combination thereof.

15. The method of claim 13, where
    I) the heat source comprises an electronic device, and
    II) the heat spreader comprises a heat sink, a thermally conductive plate, a thermally conductive cover, a fan, or a circulating coolant system.

16. The method of claim 13, further comprising: applying pressure to the composition after step 1) and before or during step 2).

17. The method of claim 13, where
    a) the first substrate comprises a heat source, and
    b) the second substrate comprises a heat spreader.

* * * * *